United States Patent [19]

Gata

[11] Patent Number: 5,376,892

[45] Date of Patent: Dec. 27, 1994

[54] SIGMA DELTA SATURATION DETECTOR AND SOFT RESETTING CIRCUIT

[75] Inventor: Daramana Gata, Dallas, Tex.

[73] Assignee: Texas Instruments Incorporated, Dallas, Tex.

[21] Appl. No.: 97,418

[22] Filed: Jul. 26, 1993

[51] Int. Cl.⁵ .............................................. H03M 3/02
[52] U.S. Cl. .............................. 327/73; 327/77; 327/336
[58] Field of Search ............... 307/359, 362, 271, 261, 307/228, 491; 341/143; 328/127; 323/321

[56] References Cited

U.S. PATENT DOCUMENTS

| | | | |
|---|---|---|---|
| 3,764,831 | 10/1973 | Zwitter et al. | 307/271 |
| 3,835,419 | 9/1974 | Milne et al. | 307/271 |
| 4,470,025 | 9/1984 | Baker | 307/228 |
| 4,542,354 | 9/1985 | Robinton et al. | |
| 4,585,951 | 4/1986 | Wuzburg | 307/228 |
| 4,746,899 | 5/1988 | Swanson et al. | |
| 4,851,841 | 7/1989 | Sooch | |
| 4,943,807 | 7/1990 | Earty et al. | |
| 4,999,634 | 3/1991 | Brazdrum et al. | 341/143 |
| 5,010,347 | 4/1991 | Yukawa | 341/143 |
| 5,061,865 | 10/1991 | Durst | 328/127 |
| 5,068,657 | 11/1991 | Tsai | 341/143 |
| 5,068,659 | 11/1991 | Sakaguchi | 341/143 |
| 5,081,372 | 1/1992 | Pelgrom | 307/359 |
| 5,087,914 | 2/1992 | Sooch et al. | |
| 5,148,170 | 9/1992 | Leopold et al. | 307/271 |
| 5,150,120 | 9/1922 | Yunus | 341/143 |
| 5,214,431 | 5/1993 | Oikawa | 341/143 |
| 5,245,343 | 9/1993 | Greenwood | 341/143 |

OTHER PUBLICATIONS

Low-Bit Conversion and Noise Shaping, Ken C. Pohlmann, Chapter 12, Advanced Digital Audio, pp. 375-421.

Primary Examiner—Timothy P. Callahan
Assistant Examiner—T. T. Lam
Attorney, Agent, or Firm—Alan K. Stewart; Richard L. Donaldson; William E. Hiller

[57] ABSTRACT

A circuit having a first integrator 46 and a sensor 20 for sensing a difference between an output voltage of the first integrator and a trip voltage provides a signal indicative of whether the output voltage is greater than the trip voltage. Resetting circuitry 40, 42 and 44 is coupled to the sensor 20 for softly bringing the output voltage lower than the trip voltage when the signal from the sensor 20 indicates that the output voltage is greater than the trip voltage.

18 Claims, 1 Drawing Sheet

SIGMA DELTA SATURATION DETECTOR AND SOFT RESETTING CIRCUIT

FIELD OF THE INVENTION

This invention generally relates to electronic systems and in particular, it relates to analog-to-digital converters.

BACKGROUND OF THE INVENTION

Without limiting the scope of the invention, its background is described in connection with sigma delta modulators, as an example.

Heretofore, in this field, sigma delta modulators are used in analog-to-digital converters. Analog-to-digital converters have seen increased use in recent years due to the advances in digital signal processing and the increased use of digital transmission systems. Typically, analog-to-digital converters comprise circuitry for receiving an analog input signal and outputting a digital value that is proportional to the input analog signal. One type of analog-to-digital converter is one that utilizes sigma-delta modulation.

The sigma-delta modulator converts an analog input into a digital pulse string having an average amplitude over time proportional to the analog input. Sigma-delta modulation provides for high accuracy and wide dynamic range, as compared to the earlier delta modulation techniques. The sigma-delta type modulation is sometimes referred to as an oversampled converter architecture which is immune from some of the earlier undesirable second order effects of delta modulation. The sigma-delta modulator is an oversampling type in which the analog input voltage is sampled at a rate that is substantially higher than the desired output sampling rate of the converter.

Sigma-delta modulation employs feedback of the output pulse train, or reference voltages or currents controlled by the output pulse train, to a summing node to which the input signal is also supplied. The difference between the two signals is then integrated. The integrator typically is an operational amplifier which has a capacitor as the feedback element. The integrated signal is compared to a predetermined reference level. When the reference level is crossed, a gate is opened or closed, either beginning or terminating an output pulse and simultaneously changing the signal being fed back to the summing node. The integrated signal is thus usually maintained in the vicinity of the reference level and, assuming an input signal varying sufficiently slower than the output pulses, the output pulse train will carry information reflecting the input amplitude to a high degree of accuracy.

Typically, if the output of a sigma-delta integrator goes into saturation (or approaches saturation), the circuit will be immediately reset to a specified value by a hard reset. The hard reset sets the output immediately to a specific value regardless of what the output value was immediately before the reset. When this hard reset occurs, relevant information will be lost in the process. Also, after a hard reset, there is a delay before the system returns to its normal operating condition.

SUMMARY OF THE INVENTION

It has been discovered that a hard reset of the sigma delta modulator has been a problem. When the sigma delta modulator is reset, information is lost in the process, and time is lost in waiting for the system to recover from the hard reset.

Generally, and in one form of the invention, a circuit comprising a first integrator and a sensor for sensing a difference between an output voltage of the first integrator and a trip voltage provides a signal indicative of whether the output voltage is greater than the trip voltage. Resetting circuitry coupled to the sensor softly brings the output voltage lower than the trip voltage when the signal from the sensor indicates that the output voltage is greater than the trip voltage.

An advantage of the invention is that it allows continuous operation of the modulator loop after the output approaches saturation, as opposed to waiting for the system to recover afar a hard reset. Another advantage of the invention is that it prevents the modulator from saturating or going unstable. This prevents overloading the modulator integrator inputs. The invention also maintains information flow without lost cycle time because there is no discontinuous switching as with a hard reset. The invention slowly brings the output to a lower voltage when saturation is approached. This maintains continuous information flow from the circuit.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
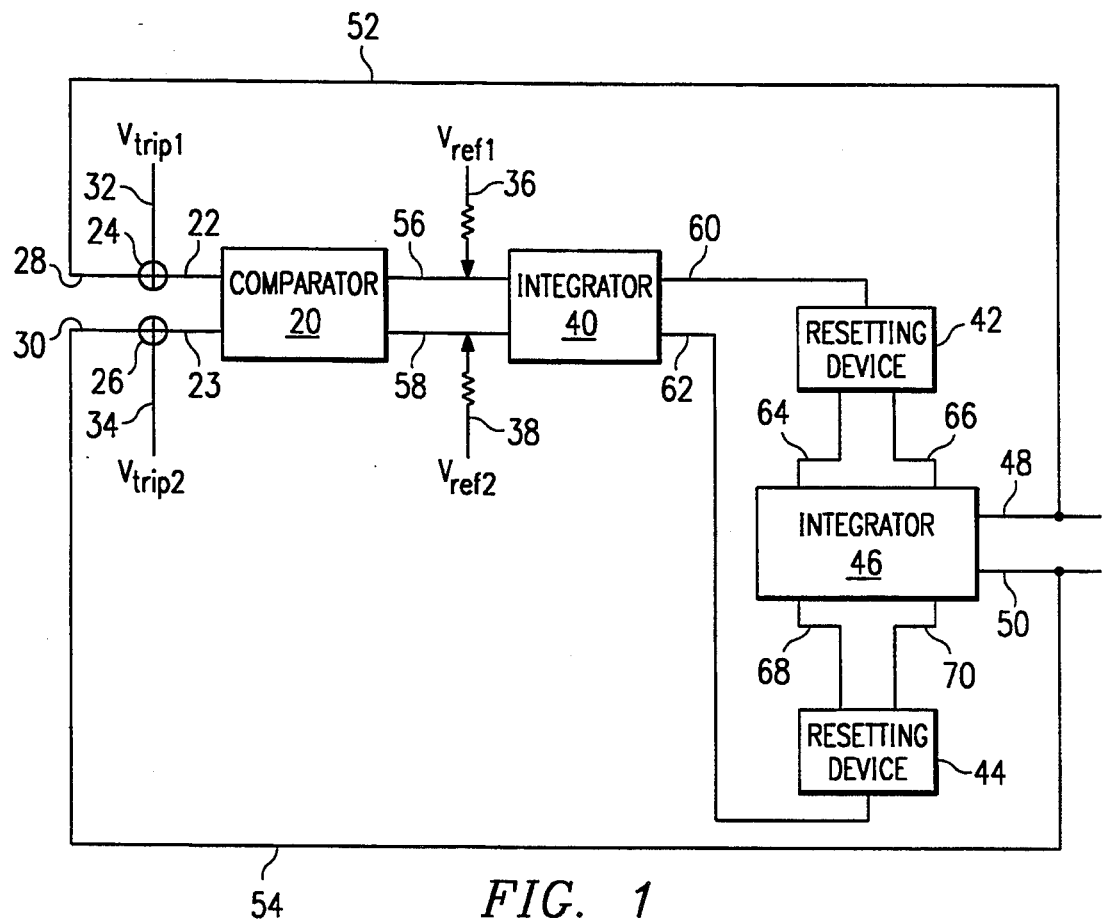
FIG. 1 is a block diagram of a saturation detector and soft resetting device according to the invention.

Referring to FIG. 1, a block diagram of a sigma delta saturation detector with a soft resetting circuit according to the present invention is illustrated. The circuit includes a comparator 20 (sensor), comparator inputs 22 and 23, summing nodes 24 and 26, feedback voltage inputs 28 and 30, trip voltage inputs 32 and 34, reference voltage inputs 36 and 38, an integrator 40, complementary resetting devices 42 and 44, a sigma delta integrator 46, and sigma delta outputs 48 and 50. The integrator 40 and the resetting devices 42 and 44 make up the soft resetting circuit. The circuit shown in FIG. 1 is a differential circuit, but the circuit could also be single ended.

The output of the sigma delta integrator 46 is supplied on lines 52 and 54 to the summing nodes 24 and 26. A trip voltage on lines 32 and 34 is also supplied to the summing nodes 24 and 26. The output from the summing nodes 24 and 26 is supplied to the input of the comparator 20 on lines 22 and 23. The output of the comparator 20 is supplied on lines 56 and 58 to the input of integrator 40. One output of the integrator 40 is supplied on line 60 to the input of the resetting device 42. The other output of the integrator 40 is supplied on line 62 to the input of the resetting device 44. The resetting device 42 is connected to the sigma delta integrator 46 on lines 64 and 66. The resetting device 44 is connected to the sigma delta integrator 46 on lines 68 and 70. Offset compensation reference voltages are supplied on lines 36 and 38 for nulling the integrator 40 to a known zero output voltage.

The feedback signals from sigma delta outputs 48 and 50 are supplied to the inputs 28 and 30. This input signal is supplied to summing nodes 24 and 26. A second signal on lines 32 and 34 is also supplied to summing nodes 24 and 26. This second signal is a trip voltage. The magnitude of the trip voltage will typically be equal to or slightly lower than the magnitude of the output saturation voltage of the sigma delta integrator 46. When the input signal crosses the trip voltage, the comparator 20 switches to a different output state. The comparator 20 typically has two output states, a low voltage state and a high voltage state, but is not limited to only two output states. When the voltage of the input signal rises to a level greater than the trip voltage, the comparator 20 will typically be set up to switch to its high voltage state.

The input signal to the saturation detector 20 is supplied from the output of the sigma delta integrator 46. When the output from the sigma delta integrator 46 moves from a level below the trip voltage to a level above the trip voltage, the comparator 20 switches from low to high. When the output of the sigma delta integrator 46 moves from a level above the trip voltage to a level below the trip voltage, the comparator 20 switches from high to low. This process provides a high output from the comparator 20 when the sigma delta integrator 46 is in saturation and a low output from the comparator 20 when the sigma delta integrator 46 is not in saturation.

The input of the integrator 40 is the output of the comparator 20. When the comparator output changes states, the integrator 40 starts integrating in a different direction. When the comparator output is high, the integrator 40 is integrating upward. When the comparator output is low, the integrator 40 is integrating downward. This means that the integrator 40 is integrating upward when a saturation state of the sigma delta integrator 46 has been detected and the integrator 40 is integrating downward when the sigma delta integrator 46 moves out of the saturation state.

The input to the resetting device 42 is the output 60 of the integrator 40. The input to the resetting device 44 is the output 62 of the integrator 40. When the integrator 40 is integrating upward, the resetting devices 42 and 44 begin to turn on. When the integrator 40 is integrating downward, the resetting devices 42 and 44 begin to turn off. Therefore, the resetting devices 42 and 44 begin to turn on when the sigma delta integrator 46 moves into saturation, and the resetting devices 42 and 44 begin to turn off when the sigma delta integrator 46 moves out of saturation. The resetting devices 42 and 44 are turned on to bring the sigma delta integrator out of saturation. The resetting devices 42 and 44 are turned off to allow the sigma delta integrator to return to its normal operating state.

The resetting devices 42 and 44 smoothly bring the output of the sigma delta integrator 46 out of saturation. When the resetting devices 42 and 44 begin to turn on, the output of the sigma delta integrator 46 begins to move out of saturation. When the resetting devices 42 and 44 begin to turn off, the sigma delta integrator 46 begins to return to its normal operating state. When the resetting devices 42 and 44 are completely off, the sigma delta integrator 46 is in its normal operating state.

When the comparator 20 switches to the high voltage state, the integrator 40 starts to integrate upward taking the integrator output voltage higher. The resetting devices 42 and 44 then begin to turn on. This smoothly brings the sigma delta integrator 46 out of saturation.

As the output voltage of the sigma delta integrator 46 moves out of saturation, the input voltage to the comparator 20 falls below the trip voltage. When the input voltage of the comparator 20 crosses the trip voltage from high to low, the comparator 20 changes states from a high voltage output to a low voltage output. The low comparator output causes the integrator 40 to start integrating downward. The voltage input to the resetting devices 42 and 44 then goes down and the resetting devices 42 and 44 begin to turn off. This gradually brings the sigma delta integrator 46 back to its normal operating condition. The sigma delta integrator 46 will then remain in its normal operating condition until the output goes above the trip voltage again.

Figure 2:
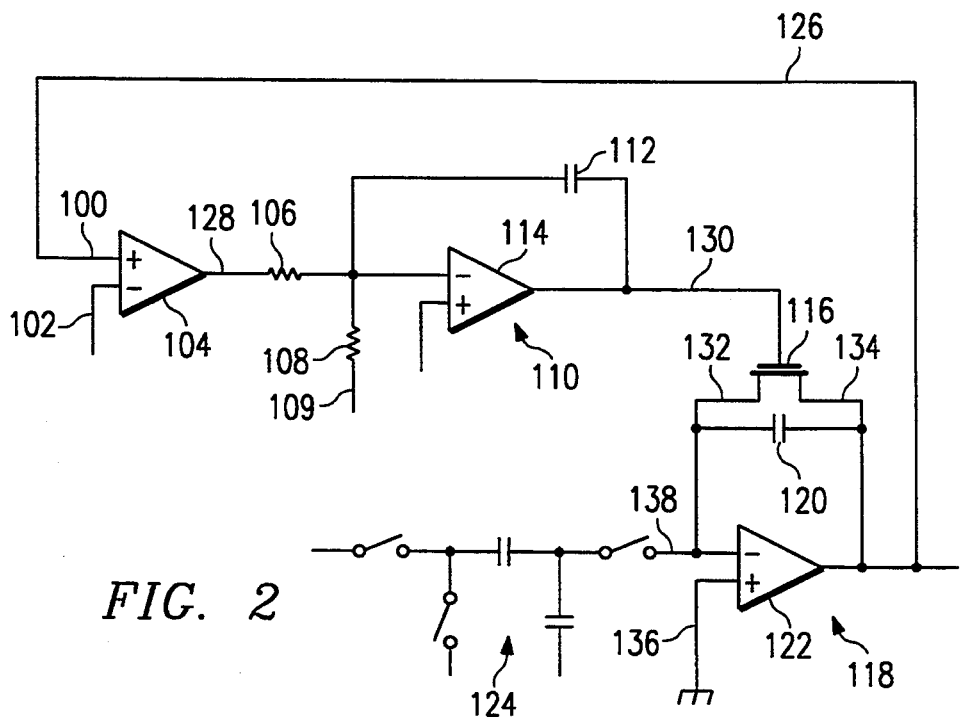
FIG. 2 is a schematic circuit diagram of a saturation detector and soft resetting circuit according to the invention.

In FIG. 2 a circuit diagram of a preferred embodiment of the saturation detector and soft resetting circuit are shown. The circuit contains feedback input line 100, trip voltage input line 102, comparator 104, first resistor 106, second resistor 108, resetting integrator 110, integrating capacitor 112, integrator operational amplifier 114, resetting transistor 116, sigma delta integrator 118, sigma delta integrating capacitor 120 (feedback network), sigma delta integrator operational amplifier 122, and switched capacitor circuit 124. The sigma delta integrator 118 consists of operational amplifier 122 and capacitor 120. The resetting integrator 110 consists of operational amplifier 114, capacitor 112, and resistor 106. The switched capacitor circuit 124 supplies the input to the sigma delta integrator 118 on line 138.

The output of the sigma delta integrator 118 is supplied on line 126 to the positive terminal of the comparator 104. A trip voltage is supplied to the negative terminal of the comparator 104 on line 102. The output of the comparator 104 is supplied on line 128 to the input of resetting integrator 110. The signal supplied on line 109 through resistor 108 is a DC offset for the resetting integrator 110. The output of the resetting integrator 110 is supplied on line 130 to the input of the resetting transistor 116. The resetting transistor 116 is connected to the sigma delta integrator 118 on lines 132 and 134. The source to drain region of the resetting transistor 116 is connected in parallel with the sigma delta integrating capacitor 120.

Since the output of the sigma delta integrator 118 is supplied to the input of the comparator 104, when the sigma delta integrator output crosses the trip voltage to the high side of the trip voltage, the comparator output switches from low to high. A positive voltage is then supplied to the resetting integrator input on line 128. This causes the resetting integrator 110 to integrate upward increasing the output voltage of the resetting integrator 110. As the integrator output goes up, the resetting transistor 116 begins to turn on. This increases the conductivity of the feedback loop of the sigma delta integrator 118. As the conductivity of the feedback loop increases, the sigma delta integrator 118 begins to gradually become a voltage follower circuit. This means that the output voltage of the sigma delta integrator 118 approaches the voltage on the plus terminal 136 of the sigma delta amplifier 122. Since the voltage on the plus terminal 136 of the sigma delta amplifier 122 is within the saturation limits of the amplifier 122, the output level of the sigma delta integrator 118 gradually moves out of saturation as the resetting transistor 116 is gradually turned on.

When the output of the sigma delta integrator 118 crosses the trip voltage to the low side of the trip voltage, the output of the comparator 104 switches from high to low. The resetting integrator 110 then starts integrating downward. As the output voltage of the resetting integrator 110 moves lower, the resetting transistor 116 begins to turn off. This decreases the conductivity of the feedback loop of the sigma delta integrator 118. This allows the feedback capacitor 120 to gradually return to its normal integrating operation, which brings the sigma delta integrator 118 back to its normal operating state. Then, the sigma delta integrator 118 will remain in its normal operating condition until it once again approaches saturation. When the sigma delta integrator 118 approaches saturation again, the resetting process described above will be repeated.

If the input to the sigma delta integrator 118 is such that the output of the sigma delta integrator 118 continues to be forced toward saturation, the resetting transistor 116 will tend to hold the output level at about the top of the range as determined by the comparator 104. This output voltage is determined by the trip voltage used in the comparator 104. In this way, the output of the sigma delta integrator 118 will rarely be allowed to go into saturation.

This invention allows the sigma delta circuit to be softly reset when the output of the sigma delta integrator 118 goes into saturation, as opposed to a hard reset. With this invention, when the sigma delta integrator 118 begins to move into saturation, it is softly brought back into the desired operating range. This soft resetting approach allows the loop to remain in operation at all times whereas a hard reset shuts off the loop of the sigma delta modulator.

This invention allows continuous operation of the sigma delta modulator loop as opposed to waiting for the system to recover after a hard reset. A hard reset sets the output immediately to a specific value regardless of where the output value was immediately before the reset. This invention also maintains information flow without lost cycle time because there is no discontinuous switching as with a hard reset. Instead, this invention slowly brings the output to a lower voltage when saturation is approached. By preventing sigma delta modulator integrators from hard resetting, the system which includes the sigma delta integrators will move out of regions of instability smoothly provided other system inputs are within nominal operating range. This prevents overloading the modulator output.

A few preferred embodiments have been described in detail hereinabove. It is to be understood that the scope of the invention also comprehends embodiments different from those described, yet within the scope of the claims.

A sigma delta modulator may have several integrators in series. Each of these integrators would have a saturation detector and resetting circuit according to this invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a first integrator;
   a sensor for sensing a difference between an output voltage of the first integrator and a trip voltage, and for providing a signal indicative of whether the output voltage is greater than the trip voltage; and
   resetting circuitry coupled between the sensor and the first integrator for softly bringing the output voltage lower than the trip voltage when the signal from the sensor indicates that the output voltage is greater than the trip voltage.

2. The circuit of claim 1 wherein the sensor is a comparator.

3. The circuit of claim 1 wherein the first integrator is a sigma delta integrator.

4. The circuit of claim 3 further comprising a switched capacitor network coupled to an input of the sigma delta integrator.

5. The circuit of claim 1 wherein the resetting circuitry includes:
   a second integrator coupled to the sensor; and
   a transistor coupled to an output of the second integrator.

6. The circuit of claim 5 wherein the second integrator is an operational amplifier with a capacitor feedback element.

7. The circuit of claim 5, further comprising a reference voltage coupled to the second integrator for nulling the second integrator to a known zero output voltage.

8. The circuit of claim 5 further comprising a resistor coupled between the sensor and the second integrator.

9. The circuit of claim 5 wherein the transistor is a MOSFET.

10. The circuit of claim 9 wherein the first integrator includes a feedback network, a drain to source region of the transistor is connected in parallel with the feedback network.

11. The circuit of claim 10 wherein the transistor controls the response of the first integrator by controlling the conductivity of the feedback network.

12. The circuit of claim 1, further comprising summing nodes for coupling the trip voltage and the output of the first integrator to the sensor.

13. The circuit of claim 1 wherein the resetting circuitry includes complementary resetting devices coupled to the first integrator.

14. A soft resetting saturation detector circuit comprising:
   comparator circuitry coupled to an output of a first integrator for comparing the output from the first integrator with a trip voltage and outputting a signal indicative of whether the output from the first integrator is greater than the trip voltage;
   a second integrator coupled to an output of the comparator;
   a transistor coupled between the second integrator and the first integrator for softly bringing the output of the first integrator below the trip voltage.

15. A method for detecting and softly resetting a saturated integrator circuit comprising:
   sensing a difference between an output voltage of the integrator circuit and a trip voltage;
   providing a resetting signal indicative of whether a magnitude of the output voltage is greater than a magnitude of the trip voltage; and
   softly bringing the integrator circuit out of saturation when the magnitude of the output voltage is greater than the magnitude of the trip voltage.

16. The method of claim 15 wherein softly bringing the integrator circuit out of saturation includes increasing the conductivity of a feedback network of the integrator.

17. The method of claim 16 wherein the feedback network is a capacitor.

18. The method of claim 17 wherein the integrator is a sigma delta integrator.

* * * * *